United States Patent
Glosser et al.

(10) Patent No.: US 10,217,573 B2
(45) Date of Patent: Feb. 26, 2019

(54) UNIVERSAL CONTACT INPUT SUPPORTING PROGRAMMABLE WETTING CURRENT

(71) Applicant: GE Intelligent Platforms, Inc., Charlottesville, VA (US)

(72) Inventors: Richard Joseph Glosser, Salem, VA (US); Venkatesh Jothiraman, Hyderabad (IN)

(73) Assignee: GE INTELLIGENT PLATFORMS, INC., Charlottesville, VA (US)

( * ) Notice: Subject to any disclaimer, the term of this patent is extended or adjusted under 35 U.S.C. 154(b) by 0 days.

(21) Appl. No.: 15/327,189

(22) PCT Filed: Jul. 22, 2014

(86) PCT No.: PCT/US2014/047600
§ 371 (c)(1),
(2) Date: Jan. 18, 2017

(87) PCT Pub. No.: WO2016/010565
PCT Pub. Date: Jan. 21, 2016

(65) Prior Publication Data
US 2017/0178825 A1  Jun. 22, 2017

Related U.S. Application Data

(63) Continuation-in-part of application No. PCT/US2014/047223, filed on Jul. 18, 2014.

(51) Int. Cl.
*G01R 31/327* (2006.01)
*H01H 1/00* (2006.01)
(Continued)

(52) U.S. Cl.
CPC ......... *H01H 1/0015* (2013.01); *G01R 31/327* (2013.01); *H01H 1/605* (2013.01); *H02J 13/00* (2013.01)

(58) Field of Classification Search
CPC .......................... H01H 1/0015; G01R 31/327
See application file for complete search history.

(56) References Cited

U.S. PATENT DOCUMENTS

| | | | | |
|---|---|---|---|---|
| 4,211,828 A * | 7/1980 | Peck | ................... | H01M 2/1653 429/11 |
| 4,532,466 A | 7/1985 | Polinski, Jr. | | |

(Continued)

FOREIGN PATENT DOCUMENTS

| | | |
|---|---|---|
| CN | 200941164 Y | 8/2007 |
| DE | 43 18 188 A1 | 12/1994 |
| EP | 1 986 203 A1 | 10/2008 |

OTHER PUBLICATIONS

International Search Report and Written Opinion issued in connection with corresponding PCT Application No. PCT/US2014/047600 dated Mar. 18, 2015.

(Continued)

*Primary Examiner* — Jermele M Hollington
*Assistant Examiner* — Feba Pothen
(74) *Attorney, Agent, or Firm* — GE Global Patent Operation; Scott R. Stanley

(57) ABSTRACT

A system and method according to various embodiments can include a universal contact input status detection circuit. A voltage source wets a contact with a wetting voltage. A current mirror circuit is connected across an input of the contact to provide a constant wetting current over a wide input voltage range. The input voltage can be varied over a range wide enough to include both AC voltages and DC voltages. The current mirror circuit maintains the constant wetting current during varying wetting voltage inputs across the input of the contact. A wetting voltage sensor senses the wetting voltage provided to the contact so that the status of the contact can be determined.

18 Claims, 5 Drawing Sheets

(51) Int. Cl.
*H01H 1/60* (2006.01)
*H02J 13/00* (2006.01)

(56) References Cited

U.S. PATENT DOCUMENTS

| | | | |
|---|---|---|---|
| 5,382,907 A | 1/1995 | Debussche et al. | |
| 5,585,701 A | 12/1996 | Kaida et al. | |
| 7,729,428 B2 | 6/2010 | Jaffer et al. | |
| 2003/0229403 A1 | 12/2003 | Nakazawa et al. | |
| 2007/0040638 A1 | 2/2007 | Bryan et al. | |
| 2010/0283512 A1* | 11/2010 | Acharya | H02J 13/002 327/101 |
| 2014/0312909 A1* | 10/2014 | Alley | G01R 31/3275 324/415 |
| 2014/0320195 A1* | 10/2014 | Desai | H01H 47/002 327/382 |

OTHER PUBLICATIONS

Machine Translation and First Office Action and Search issued in connection with corresponding CN pplication No. 201480080674.5 dated Jan. 19, 2018.

* cited by examiner

UNIVERSAL CONTACT INPUT SUPPORTING PROGRAMMABLE WETTING CURRENT

I. FIELD OF THE INVENTION

The present invention relates generally to controlling a process. More particularly, the present invention relates to monitoring electrical contacts, especially relays, and detecting the status of electrical contacts used in an industrial or commercial process that are wetted with alternating current (AC) voltage or direct current (DC) voltage.

II. BACKGROUND OF THE INVENTION

Over the years, a full range of relay products from highly specialized relays for communication equipment to general-purpose relays have been designed to control nearly every function in commercial and industrial processes used in everything from household appliances to industrial machinery. A power generation plant is one example of an industrial process in which a large number of relays are used. The relays in a power generation plant can be used to control a wide variety of equipment such as motors, pumps, solenoids and lights. However, even the best relays may fail at some point.

In the example scenario above, a control system needs to monitor the relays within the power plant to determine their status in order to ensure that certain functions associated with the process are being performed. In particular, contact input status detection circuits are used to detect the status of relay contacts when in use in the field. The contact input status detection circuit monitors provide an indication of potentially degraded electrical relay performance due to contamination.

In industrial environments, contamination routinely interferes with the operation of the relay's contact. Contaminants, which can include oxidation films or foreign particles, tend to produce contact resistance readings that are either high or unstable. Contamination commonly happens with low current applications, usage in high temperature and humidity environments, and during extended periods of storage.

For example, in small currents and low voltage applications, oxidation of relay contact is simply a buildup of corrosion on relay contact surfaces over a period of time. The contacts develop oxidation, which is a thin layer of oxide on the contact surface. It causes problems by increasing the resistance across the contacts which, depending on the amplitude of the voltage being switched, can cause loss of signal or overheating of the contacts.

Oxidation on relay contacts is especially a problem with small currents and low voltages, because they cannot punch through the oxide layer once it accumulates and becomes too thick. However, higher voltages may punch through the oxidation layer during relay switching. Thus, the issue with switch contacts is voltage. Current through the contact is strictly a function of the voltage and the impedance of the circuit the contact completes. By varying the current, the voltage varies. Once the voltage is great enough, the punch through voltage is achieved.

One conventional approach to resolve this issue for small currents and low current applications is by passing the required wetting current through the relay contacts so that it punches through the oxide layer. The wetting current is the minimum current needed to flow through a contact to break through any film (contact oxidation) that may have been deposited on the switch. Typically, this has been performed by different group of boards connected in order to support a wide range of contact input voltages.

III. SUMMARY OF THE INVENTION

Given the aforementioned deficiencies, a need exists for a single circuit, capable of monitoring switches, in general, and relay contacts, in particular, to determine the status of the contacts. There also remains a need for a single contact status detection circuit, which is capable of supporting contact input voltage ranges, including both AC and DC voltages.

A further need exists for a single circuit capable of maintaining constant wetting current across a wide input range. In addition, a need remains to provide a constant current across a contact input (digital input) over a wide voltage range as a means to abate contact oxidation (corrosion/increased impedance) and improve reliability of the signal chain.

A system according to various exemplary embodiments can include a universal contact input status detection circuit, comprising a voltage source that wets a contact with a wetting voltage. A wetting voltage sensor senses the wetting voltage provided to the contact. A current mirror circuit is connected across an input of the contact to provide a constant wetting current over a wide input voltage range. The input voltage can be varied over a range wide enough to include both AC voltages and DC voltages. The current mirror circuit maintains the constant wetting current during varying wetting voltage inputs across the input of the contact. A divider scales down the wetting voltage. A comparator that compares the wetting voltage to a reference wetting voltage to provide a digital output voltage. A processor determines the status of the contact in accordance with the digital output voltage. The detection circuit is integrated on a single circuit board configuration.

A method of detecting a status of a contact according to various exemplary embodiments can include wetting a contact with a wetting voltage; sensing the wetting voltage provided to the contact; providing a constant wetting current across an input of the contact over a wide input voltage range; maintaining the constant wetting current during varying wetting voltage inputs utilizing a current mirror connected across an input of the contact; scaling down the wetting voltage; comparing the wetting voltage to a reference wetting voltage to provide a digital output voltage; and determining the status of the contact in accordance with the digital output voltage. The detection of the status of the contact is implemented on a single circuit board.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

Figure 1:
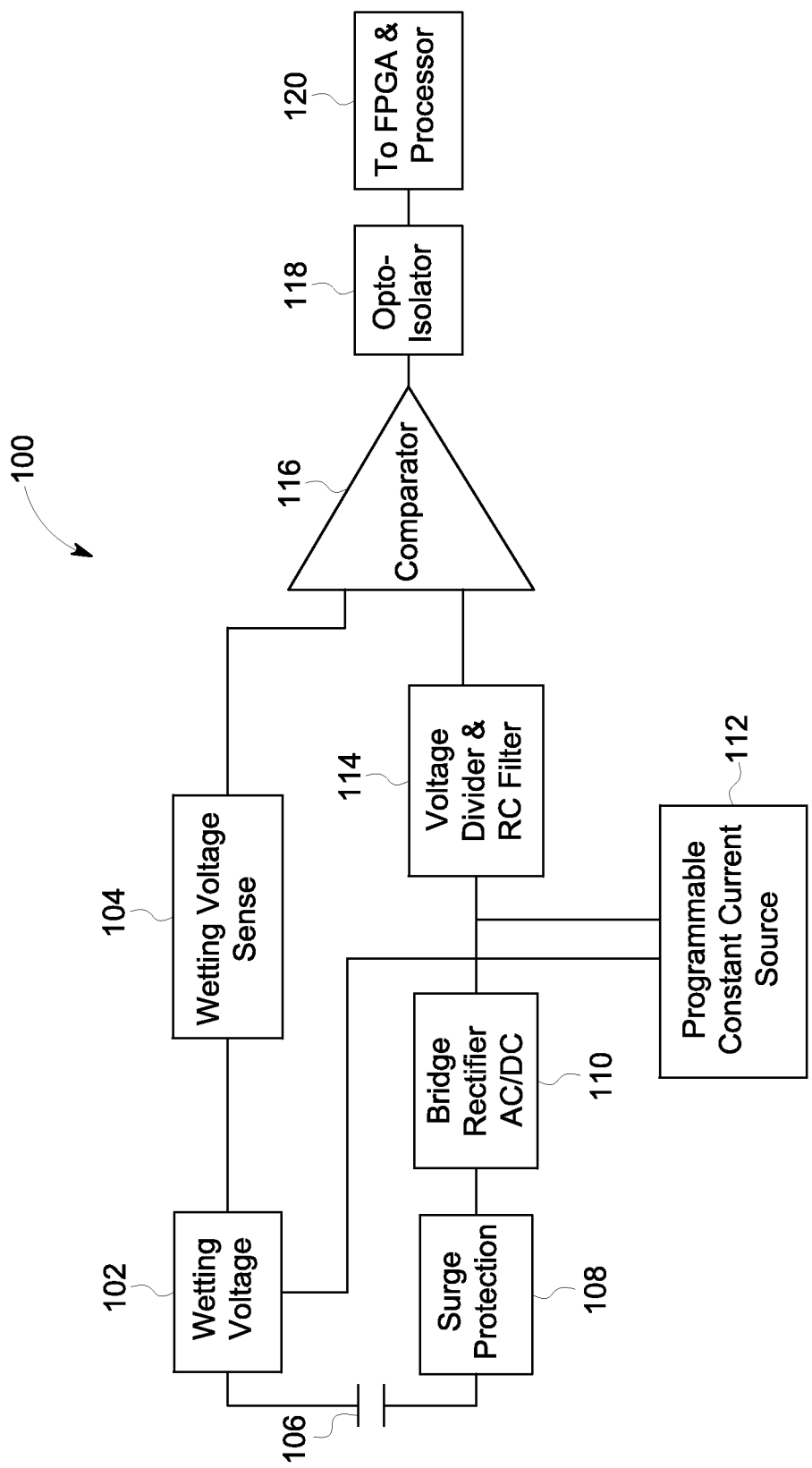
FIG. 1 shows a schematic diagram of an exemplary circuit used to detect the status of an electric contact in accordance with the present teachings.

The present invention may take form in various components and arrangements of components, and in various process operations and arrangements of process operations. The present invention is illustrated in the accompanying drawings, throughout which, like reference numerals may indicate corresponding or similar parts in the various figures. The drawings are only for purposes of illustrating preferred embodiments and are not to be construed as limiting the invention. Given the following enabling description of the drawings, the novel aspects of the present invention should become evident to a person of ordinary skill in the art.

V. DETAILED DESCRIPTION OF VARIOUS EMBODIMENTS

The following detailed description is merely exemplary in nature and is not intended to limit the applications and uses disclosed herein. Further, there is no intention to be bound by any theory presented in the preceding background or summary or the following detailed description.

Throughout the application, description of various embodiments may use "comprising" language, however, it will be understood by one of skill in the art, that in some specific instances, an embodiment can alternatively be described using the language "consisting essentially of" or "consisting of."

For purposes of better understanding the present teachings and in no way limit the scope of the teachings, it will be clear to one of skill in the art that the use of the singular includes the plural unless specifically stated otherwise. Therefore, the terms "a," "an" and "at least one" are used interchangeably in this application.

Unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that may vary depending upon the desired properties sought to be obtained. In some instances, "about" can be understood to mean a given value±5%. Therefore, for example, about 100 nm, could mean 95-105 nm. At the very least, each numerical parameter should at least be construed in light of the number of reported significant digits and by applying ordinary rounding techniques.

Various embodiments provide a system and method consisting of a single circuit, which is capable of monitoring switches, in general, and relay contacts, in particular, to determine the status of the contacts.

Various embodiments provide a system and method consisting of a single circuit, which is capable of supporting universal contact input voltage range, including both AC and DC voltages, and maintaining a constant wetting current across a wide input range.

Various embodiments provide a system and method that provides a constant wetting current across a wide input range. Various embodiments provide a configurable wetting current.

In various embodiments, a system and method provides a constant current across a contact input (digital input) across a wide voltage range as a means to abate contact oxidation (corrosion/increased impedance) and improve reliability of the signal chain. Various embodiments disclose a method that creates a software and firmware programmable wetting current and a method for multi-stage wetting currents. Various embodiments disclose a system and method for monitoring the status of wetting voltage and wetting current.

FIG. 1 is a schematic diagram of a contact status detection circuit 100 used to detect the status of an electric contact (hereinafter "contact") as used, for example, in an industrial or commercial process according to one embodiment of the present invention. As used herein, a contact is an electrical component for joining electric circuits together or breaking the circuits by interrupting or diverting the current from one conductor to another. Examples of contacts include electrical components such as switches, relays, terminals and connectors.

One example of an industrial process in which embodiments of the present invention is suitable for use is with a power generation plant where a large number of contacts are used to control a wide variety of equipment such as motors, pumps, solenoids and lights. Those skilled in the art will recognize that embodiments of the present invention are applicable to other industrial processes where contacts are used to control the operation of process equipment and where it is desirable to ascertain the status of such contacts for the purpose of sequence of events (SOE) analysis.

Some of the exemplary features provided by detection circuit 100 include a constant wetting current across a wide input voltage range, a system configurable wetting current, and a single circuit board configuration capable of supporting a wide input voltage range.

As shown in FIG. 1, detection circuit 100 provides a single circuit configuration to support a universal contact having an input voltage range which permits both AC and DC and is capable of maintaining a constant wetting current across the wide input range. The "universal" designation indicates that the circuit is configurable to detect the status of relays controlling various devices. Detection circuit 100 provides a constant current across a contact input (digital input) across a wide voltage range as a means to abate contact oxidation (corrosion), which increases the impedance and improves reliability of the signal chain.

Traditionally, the wetting current was provided by static resistor combinations requiring multiple resistor populations to achieve the desired currents. In contrast, circuit 100, in addition to the various embodiments described in accordance with the present teachings, provides a constant current across a wide range of voltage with a single circuit realization (non-changing). This eliminates the need to produce and maintain customized circuit variants on a per-wetting voltage basis.

Additionally, detection circuit 100 is capable of implementing various methods of operation. For example, in various embodiments, circuit 100 performs a method of operation for both DC and AC wetting voltages. Various embodiments provide a method to create a programmable software/firmware (SW/FW) wetting current.

Furthermore, circuit 100 is capable of implementing a method of monitoring the status of wetting voltage and wetting current. The "wetting voltage" (also known as "sense voltage') is the voltage provided to electrical contacts for status detection. The wetting voltage is used to detect the operation of either a contact opening or closing.

To monitor the status of the electrical contacts, an electrical voltage (e.g. a direct current voltage (DC) or an alternating current (AC) voltage) is sent to the contacts in the field to determine whether this voltage can be detected. Detecting the voltage is an indication that the electrical current is on or off.

As discussed above, if the contact is operated in a low voltage application, the contacts will tend to accumulate excessive resistance and may fail prematurely. In order to keep the switch in good health, the "wetting current" is the minimum current needed to flow through a contact to break through any film (contact oxidation) that may have been deposited on the switch.

Thus, detection circuit 100 is capable of detecting status conditions that include whether the contact is closed, the contact is open, or the contacts are contaminated due to corrosion (oxidation).

Detection circuit 100 also is capable of performing a method for multi-stage wetting currents, wherein initial higher currents are applied for punch through with secondary lower currents. It is advantageous to have initial currents higher than nominal wetting currents to provide a means to punch through existing oxidation (corrosion) on external contact tips and then fall back to the desired constant current level. The option for multiple current set points is not available for a static input impedance circuit realization used in conventional circuits.

In comparison, conventional circuits derive a nominal input current utilizing static resistance to common (ground, earth, etc.) which are produced and maintained as separate input types for discrete wetting voltages (nominal 24 VDC, 48 4 DC, 125 VDC, etc.). With tolerance on the nominal voltages, the wetting current derived will also vary due to the static resistance. Additionally, a conventional circuit for 24 VDC input will have half (A) the current of a 48 volt realization (due to the static input impedance) and will require either a separate 48 volt implementation. Such a conventional circuit will also require use of different currents for differing wetting voltages and in all cases will require the acceptance of varying current with voltage tolerance.

In reference to FIG. 1, detection circuit 100 incorporates a switch, such as a relay, having a pair of contacts 106. Wetting voltage sense 104 is used as a sensing circuit for contact sensing. The status of contacts is typically monitored by sending an electrical voltage such as DC voltage or AC voltage in the field to the contacts and then determining whether this voltage can be detected. The wetting voltage is the voltage applied to a contact in order to detect its status, as discussed above.

Wetting voltage 102 is passed through the contacts 106 to sense the status of relay contacts 106. Input terminals (not shown) of the contacts 106 receive the wetting voltage 102 (AC/DC). A surge protection 108 protects the circuit from a voltage spike. A bridge rectifier AC/DC 110 can be incorporated in circuit 100 in various embodiments to accommodate AC wetting voltages, as well as DC voltages.

A constant current 112 is provided across the contact input 106 (digital input) across a wide voltage range as a means to abate contact oxidation (corrosion), increase impedance, and improve reliability of the signal chain. The constant current 112 across the varying wetting voltage inputs is accomplished by the use of a current mirror across the input section of the contact input 106 (digital input). The use of the current mirror forces the input to draw a current from the wetting voltage source 102 as a function of the constant current 112 within the detection circuit and not a function of the input impedance of the detection circuit.

In contrast, known prior attempts have focused on the source current in the wetting voltage system for providing a constant current output. In these conventional techniques, since wetting voltage is typically applied as a bulk source, it has become a requirement to support as many constant current wetting voltage sources as there are contact input circuits. This leads to a reduction in system flexibility.

Referring back to FIG. 1 according to the present teachings, a programmable resistance can also be provided within the constant current 112. The programmable resistance in the internal constant current 112 can be varied to provide a software/firmware (SW/FW) programmable means in order to change the constant input current.

A voltage divider and a resistor-capacitor (RC) filter 114 scales down the wetting voltage and the output is fed to a comparator 116 for comparison to a reference wetting voltage. The output of the comparator is passed through a digital isolator 118 (opto-isolator) to a field-programmable gate array (FPGA) and processor 120, which detects the contact status and informs (declares) the system.

Figure 2:
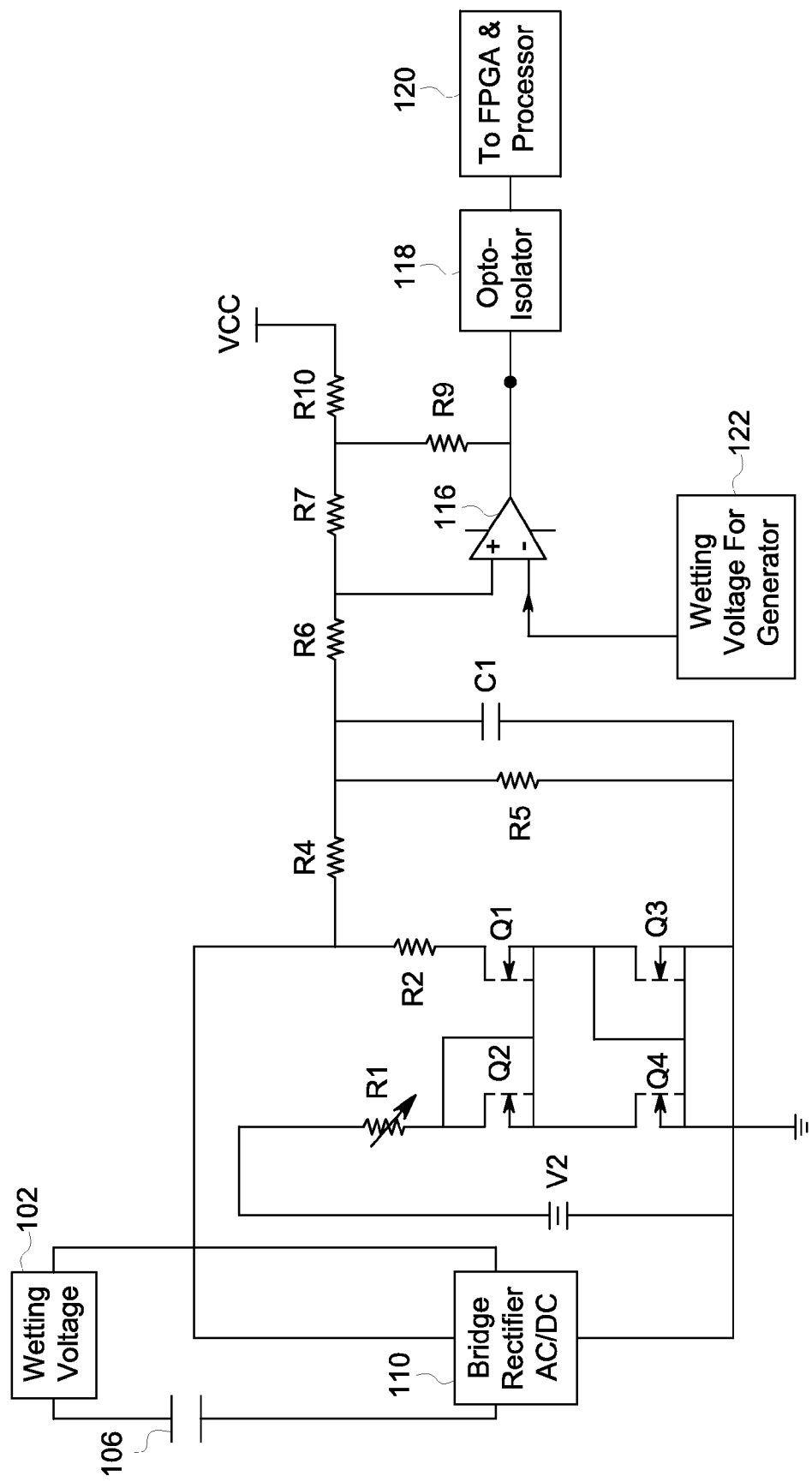
FIG. 2 is a schematic circuit diagram of an exemplary contact status detection circuit in accordance with the present teachings.

FIG. 2 shows a circuit diagram that depicts the operation of the detection circuit 100 shown in FIG. 1. In various embodiments, a wetting voltage is used to drive a wetting current to abate the occurrence of high impedance across the contacts connected to the contact input (digital input) of the detection circuit 100. In FIG. 2, wetting voltage 102 is passed through the customer contacts 106 to sense the status of relay contacts 106. Bridge rectifier 110 rectifies AC to DC when AC wetting voltage is used. A current mirror circuit keeps the wetting current constant 112. Voltage divider 114 scales down the voltage so that comparator 116 compares it with reference wetting voltage to detect the contact status.

In FIG. 2, the current mirror replicates the input current to make a copy as an output current. Accordingly, resistor R1 on the left changes the current flow in the left half, which is mirrored in the right half by the current mirror circuit. Irrespective of the wetting voltage, the wetting current is maintained constant. The current mirror serves as a simple current regulator, supplying nearly constant current over a wide input voltage range.

Resistors R4 and R5 scales down the voltage. The RC filter 114, which is composed resistors R4 and R5 and capacitor C1, is incorporated in the circuit for bypassing unwanted signals and for providing debouncing to filter out the rapid changes in the switch output. The scaled down voltage is compared by the comparator 116 with reference wetting voltage 122. The comparator 116 output is passed to the FPGA 120 through digital isolator 118 for detecting the contact status and declaring it to system.

Figure 3:
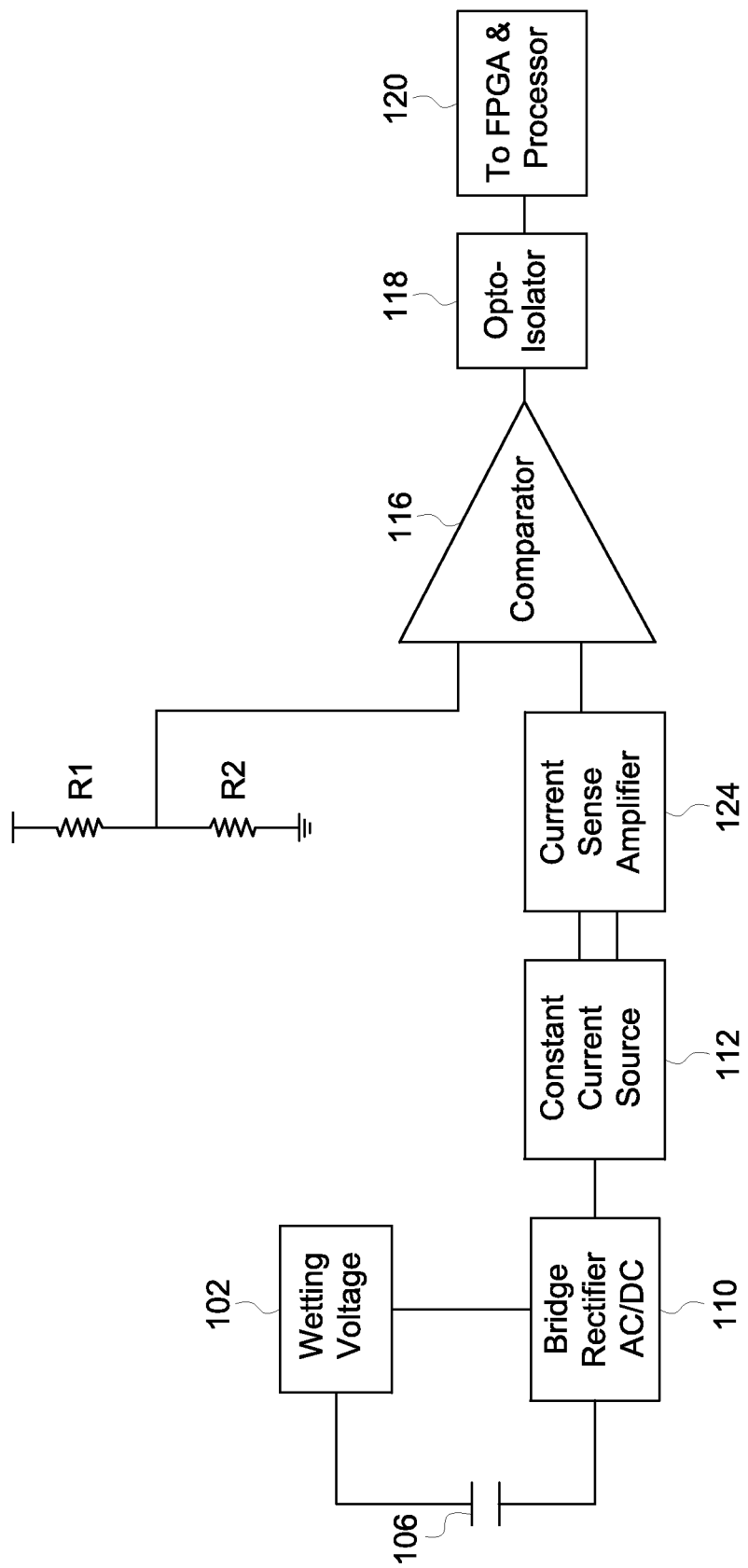
FIG. 3 is another exemplary embodiment of a schematic circuit diagram of a contact status detection circuit in accordance with the present teachings.

The detection circuit 100 can be implemented by alternative methods. FIG. 3 is a circuit diagram, which illustrates a first embodiment for implementing detection circuit 100. In FIG. 3, a wetting voltage 102 is passed through the contacts 106 to sense the status of relay contacts 106. Bridge rectifier 110 rectifies AC to DC when AC wetting voltage is used.

Current mirror circuit keeps the wetting current constant 112. Current sense amplifier 124 senses the current and outputs the voltage, which will be compared by comparator 116 against wetting voltage reference to detect the contact status. The digital signal is passed to the system through FPGA and processor 120. R1 is a programmable resistor which can be used to self-test the response of the digital isolator 118.

Figure 4:
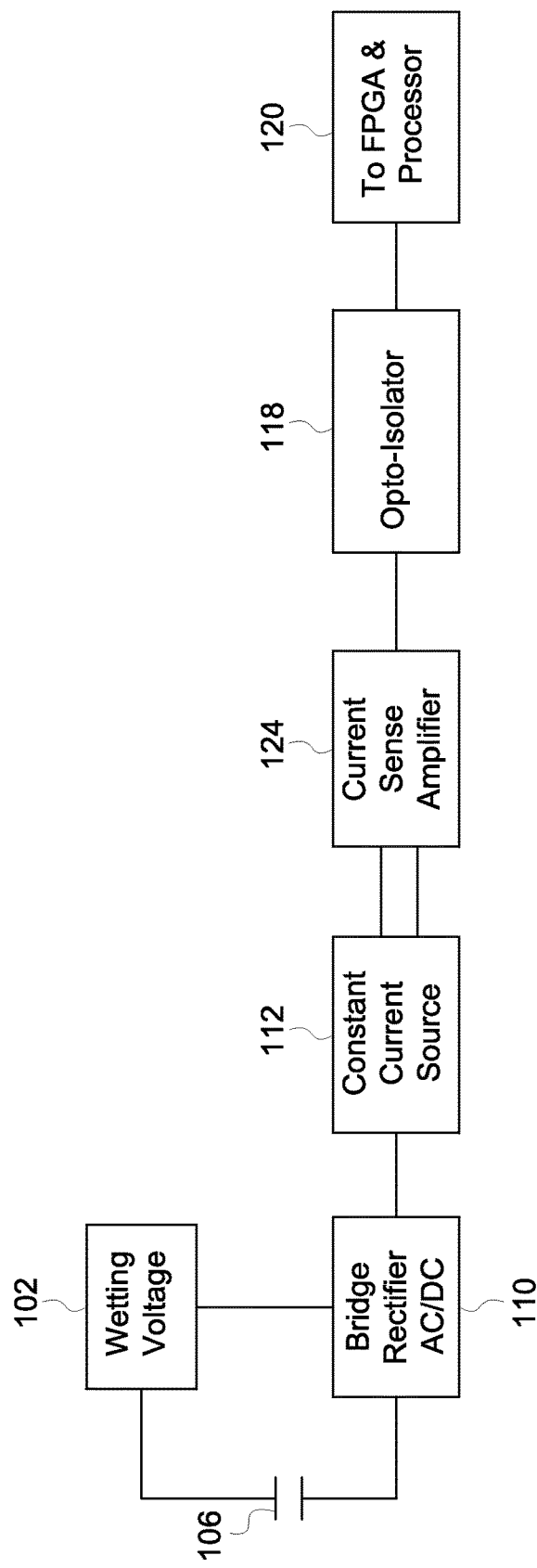
FIG. 4 is yet another exemplary embodiment of a schematic circuit diagram of a contact status detection circuit in accordance with the present teachings.

FIG. 4 depicts a circuit diagram, which illustrates a second method for implementing detection circuit 100. In FIG. 4, a wetting voltage is passed through the contacts 106 to sense the status of relay contacts 106. Bridge rectifier 110 rectifies AC to DC when AC wetting voltage is used. A current mirror circuit keeps the wetting current constant 112. Current sense amplifier 124 senses the current and outputs the voltage, which in turn will drive the digital isolator 118 to inform the system about the status of contacts through FPGA and processor 120.

Figure 5:
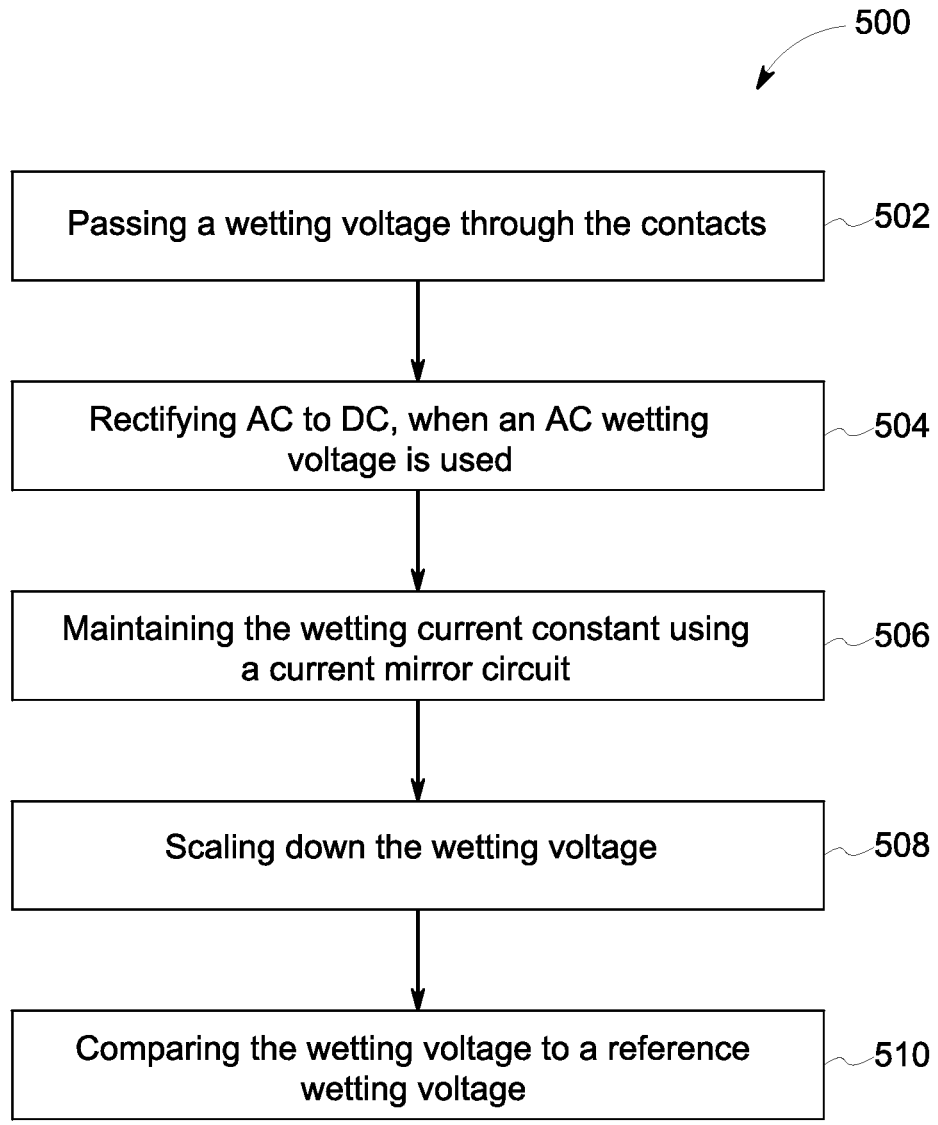
FIG. 5 is a flowchart of an exemplary method of practicing the present invention in accordance with the present teachings.

FIG. 5 is a flowchart explaining a method 500 for detecting the status of contacts according to the present teachings. In Step 502, a wetting voltage is passed through the contacts to sense the status of the relay contacts. In Step 504, a bridge rectifier rectifies AC to DC when AC wetting voltage is used. In Step 506, a current mirror maintains the wetting current at a constant level. In Step 508, a voltage divider scales down the wetting voltage. In Step 510, a comparator compares the scaled down wetting voltage to a reference wetting voltage to detect the contact status.

Contact status detection circuits designed in accordance with embodiments of the present invention have numerous commercial and technical advantages. For example, a commercial advantage of the circuit and method is the ability to design, deploy and maintain a single contact input detection circuit which is applicable across the entire wetting voltage range supported, versus the need to employ customized circuits for each nominal wetting voltage. Improved performance is achieved with a simplified system design.

The use of the detection circuit in product designs simplifies manufacturing activities such as product assembly, product maintenance, and design maintenance. This eliminates the possibility of installing the wrong custom module in the field by mistake. In conventional circuits, when each wetting voltage is supported by a custom circuit realization, the field replacements can install the wrong voltage input circuit, which can be attributed to a plurality of error sources to which the prior-art circuits are susceptible.

One of several technical advantages is the ability to provide a constant current, which is settable to a level determined to be most advantageous in contact oxidation (corrosion) abatement. Another technical advantage is the ability to provide a means to facilitate a higher current initially for punch through and then fall back to a lower setting to prevent heating/welding or improve contact longevity. A further technical advantage is to provide a programmable constant current source that can be changed or customized by software when the constant current level is determined to produce better abatement results at a different setting.

An additional technical advantage is that the contact input health can be determined by varying the constant current input and monitoring for a change in detection state and an indication of unacceptable contact resistance (detects field contacts that are marginal). The contact input health check can be performed on a running input without the need to interrupt the signal chain.

Alternative embodiments, examples, and modifications which would still be encompassed by the invention may be made by those skilled in the art, particularly in light of the foregoing teachings. Further, it should be understood that the terminology used to describe the invention is intended to be in the nature of words of description rather than of limitation.

Those skilled in the art will also appreciate that various adaptations and modifications of the preferred and alternative embodiments described above can be configured without departing from the scope and spirit of the invention. Therefore, it is to be understood that, within the scope of the appended claims, the invention may be practiced other than as specifically described herein.

We claim:

1. A method of detecting a status of a contact, the method comprising:
    wetting a contact with a wetting voltage;
    sensing the wetting voltage provided to the contact;
    providing an initial wetting current to enable punch through of oxidation on the contact;
    subsequently providing a constant wetting current across an input of the contact over a wide input voltage range, the constant wetting current being relatively lower than the initial wetting current;
    maintaining the constant wetting current during varying wetting voltage inputs utilizing a current mirror connected across the input of the contact;
    scaling down the wetting voltage;
    comparing the wetting voltage to a reference wetting voltage to provide a digital output voltage; and
    determining the status of the contact in accordance with the digital output voltage.

2. The method according to claim 1, wherein the wide input voltage range comprises AC voltages and DC voltages.

3. The method according to claim 2, implementing the detection of the status of the contact on a single circuit board.

4. The method according to claim 1, further comprising providing the constant wetting current across the contact input over the wide voltage range to abate contact oxidation.

5. The method according to claim 1, further comprising implementing wetting current updates via at least one of a programmable software and a programmable firmware.

6. The method according to claim 1, further comprising monitoring a status of the wetting voltage and the wetting current.

7. The method according to claim 1, further providing a programmable constant current source that is adjustable to another constant current level by software in response to a determination that another level of constant current produces better abatement results.

8. The method according to claim 1, further comprising determining the status of the contact input by varying the constant current input and monitoring for a change in a detection state.

9. The method according to claim 1, further comprising performing a check on the status of the contact input during a running input without interrupting a signal chain.

10. The method according to claim 1, further comprising rectifying an AC wetting voltage to a DC wetting voltage, when the AC wetting voltage is received.

11. A universal contact input status detection circuit, comprising:
    a voltage source that wets a contact with a wetting voltage;
    a wetting voltage sensor that senses the wetting voltage provided to the contact;
    a current mirror circuit connected across an input of the contact to provide an initial wetting current to enable punch through of oxidation on the contact and to subsequently provide a constant wetting current over a wide input voltage range and to maintain the constant wetting current during varying wetting voltage inputs across the input of the contact, wherein the wide input voltage range comprises AC voltages and DC voltages, the constant wetting current being relatively lower than the initial wetting current;

a divider that scales down the wetting voltage;

a comparator that compares the wetting voltage to a reference wetting voltage to provide a digital output voltage; and a processor that determines the status of the contact in accordance with the digital output voltage.

12. The circuit according to claim 11, wherein the detection circuit IS integrated on a single circuit board comprising the processor configured to control operation of the detection circuit.

13. The circuit according to claim 12, wherein the current mirror circuit provides the constant wetting current across the contact input over the wide voltage range to abate contact oxidation.

14. The circuit according to claim 12, wherein the wetting current IS capable of being updated via at least one of a programmable software and a programmable firmware.

15. The circuit according to claim 12, wherein a status of the wetting voltage and the wetting current is monitored.

16. The circuit according to claim 12, wherein a programmable constant current source is adjustable to another constant current level by software in response to a determination that another level of constant current produces better abatement results.

17. The circuit according to claim 12, further comprising wherein the status of the contact input is determined by varying the constant current input and monitoring for a change in a detection state.

18. The circuit according to claim 12, wherein a bridge rectifier rectifies the AC wetting voltage to the DC wetting voltage, when the AC wetting voltage is received.

* * * * *